United States Patent
Tomihara

(10) Patent No.: US 6,649,448 B2
(45) Date of Patent: Nov. 18, 2003

(54) METHOD OF MANUFACTURING A SEMICONDUCTOR DEVICE HAVING FLEXIBLE WIRING SUBSTRATE

(75) Inventor: Seiichi Tomihara, Nanae (JP)

(73) Assignees: Hitachi, Ltd., Tokyo (JP); Hitachi Hokkai Semiconductor, Ltd., Hokkaido (JP)

(*) Notice: Subject to any disclaimer, the term of this patent is extended or adjusted under 35 U.S.C. 154(b) by 0 days.

(21) Appl. No.: 09/961,368

(22) Filed: Sep. 25, 2001

(65) Prior Publication Data

US 2002/0041025 A1 Apr. 11, 2002

(30) Foreign Application Priority Data

Oct. 5, 2000 (JP) .................................. 2000-306048

(51) Int. Cl.⁷ .............................................. H01L 21/48
(52) U.S. Cl. ....................................... 438/113; 438/127
(58) Field of Search ................................ 438/112, 114, 438/126, 127, 106, 110, 125, 113

(56) References Cited

U.S. PATENT DOCUMENTS 5,970,320 A * 10/1999 Yamasaki et al. ............ 438/123
5,985,695 A * 11/1999 Freyman et al. ............. 438/112
6,166,433 A * 12/2000 Takashima et al. .......... 257/702

FOREIGN PATENT DOCUMENTS

| JP | 56-067934 A | * | 6/1981 | ........... H01L/21/78 |
| JP | 09-205071 A | * | 8/1997 | ......... H01L/21/301 |
| JP | 11-214588 | | 8/1999 | |
| JP | 2000-124163 | | 4/2000 | |

* cited by examiner

Primary Examiner—Kamand Cuneo
Assistant Examiner—Evan Pert
(74) Attorney, Agent, or Firm—Mattingly, Stanger & Malur, P.C.

(57) ABSTRACT

Peeling between a molding resin and a substrate is prevented to improve the quality of a semiconductor device. A film substrate capable of being deformed following shrinkage upon curing of a molding resin and having plural partitioned device areas is provided. Then, a block molding is performed so as to cover the plural device areas in a lump on a chip bearing surface side of the film substrate. Thereafter the film substrate is subjected to dicing wherein a cutting blade is advanced toward a block molding portion to divide the film substrate device area by device area in accordance with a down cutting method, whereby peeling of the substrate in the dicing work can be prevented.

5 Claims, 16 Drawing Sheets

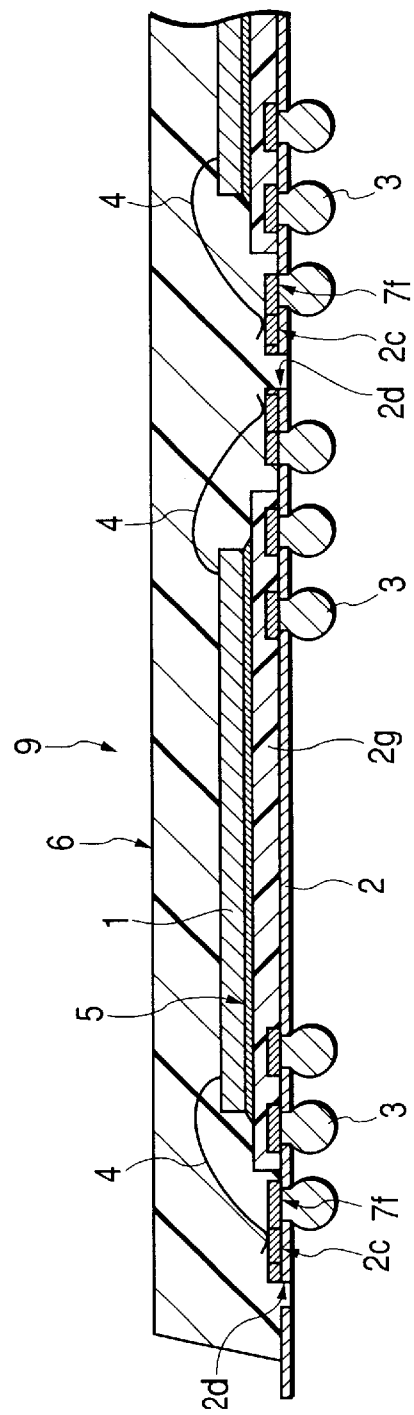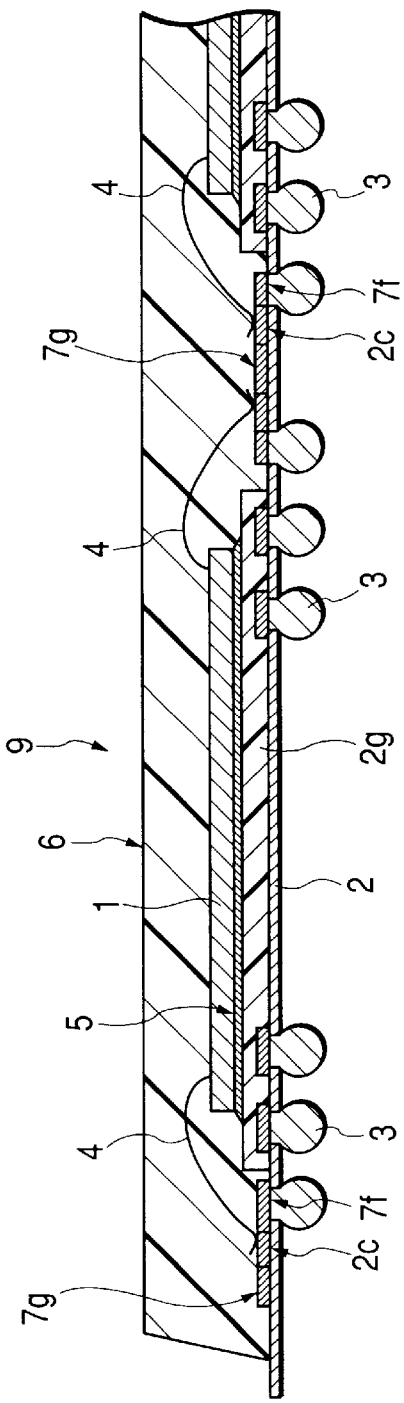

METHOD OF MANUFACTURING A SEMICONDUCTOR DEVICE HAVING FLEXIBLE WIRING SUBSTRATE

BACKGROUND OF THE INVENTION

The present invention relates to a semiconductor manufacturing technique and more particularly to a technique useful in its application to the improvement in the quality of a semiconductor device.

As examples of semiconductor devices having a semiconductor chip with a semiconductor integrated circuit formed thereon, further having bump electrodes (e.g., solder balls) as external terminals and a wiring board which supports the semiconductor chip, there are known CSPs (Chip Scale Packages) or BGAs (Ball Grid Arrays).

As to the former CSP there has been developed a CSP which is small-sized and thin-walled, like the chip size or slightly larger than a semiconductor chip, and wherein a semiconductor chip is mounted on one side, i.e., on a chip bearing surface, of a wiring board, the chip bearing surface side being sealed with resin by molding to form a sealing portion.

As a technique for improving the CSP manufacturing efficiency and thereby attaining the reduction of cost there has been developed a block molding method.

According to the block molding method, a multi device substrate is used on which plural device areas corresponding to thin film wiring boards are formed in a partitioned and contiguous manner and are sealed with resin by molding while being covered together. After the sealing with resin, dicing is performed for division (formation of individual pieces) into each device area.

This semiconductor device manufacturing method using such a block molding method, as well as the structure of the semiconductor device are disclosed, for example, in Japanese Unexamined Patent Publication No. 2000-124163 or Hei 11 (1999)-214588.

SUMMARY OF THE INVENTION

In the above publication 2000-124163 there is described a countermeasure to peeling at an interface between a substrate and a molding resin which exfoliation is caused by an internal stress developed between the resin and the substrate.

As described in the above publication, the case where an internal stress is created due to a difference in thermal expansion coefficient between the substrate and the molding resin is based on the premise that the strength of the substrate is so high as to generate a force resistive to a relative deformation (difference in volume change) between the molding resin and the substrate.

As the cause of occurrence of a relative deformation between the molding resin and the substrate there is shrinkage on curing of the molding resin, in addition to the aforesaid difference in thermal expansion coefficient. The shrinkage on curing of the molding resin indicates a decrease of volume caused by a bonding force based on a crosslinking reaction when a polymer which constitutes the resin cures on heating.

Thus, the molding resin and the substrate give rise to a relative deformation due to a difference in thermal expansion coefficient or shrinkage of the resin on curing. However, by adopting a substrate which is flexible enough to follow up the deformation of the molding resin, it is possible to keep the internal stress between the substrate and the molding resin very low.

Moreover, by adopting a thin film substrate it is possible to attain the reduction in thickness of the semiconductor device. Further, polyimide is superior in heat resistance, anti-hygroscopic property and adhesion to the molding resin and is very suitable as a substrate material for a semiconductor device.

However, the use of a flexible material as the substrate material gives rise to the problem that peeling is apt to occur at the substrate-molding resin interface due to a stress induced by a blade at the time of dicing.

Particularly, when up cutting is performed as in FIG. 11(d) or 11(e), a force is exerted in a direction to peel off the substrate from the molding resin with a blade in a cutting portion, so that the problem of substrate peeling is apt to occur.

At a corner portion of each device area where dicing lines cross each other, stress is easily concentrated at a vertex of the corner portion. Besides, at and around the corner portion damage is given to the substrate twice from the blade and thus the corner portion is particularly apt to cause the problem of substrate exfoliation.

It is an object of the present invention to provide a semiconductor device and a method of manufacturing the same capable of preventing the exfoliation between a molding resin and a substrate and improving the quality of the semiconductor device.

The above and other objects and novel features of the present invention will become apparent from the following description and the accompanying drawings.

As to typical modes included in the present invention, a brief description will be given below.

In one aspect of the present invention there is provided a semiconductor device comprising a thin film wiring board which supports a semiconductor chip, with cutout portions being formed in peripheral edge portions of the thin film wiring board, and which is deformable following shrinkage on curing of a molding resin, a conductive member for connecting each surface electrode on the semiconductor chip with the thin film wiring board, a sealing portion which is constituted by the molding resin and which seals the semiconductor chip and the conductive member with resin, the sealing portion having a sealing body portion formed on a chip bearing surface of the thin film wiring board and sealing end portions located in the cutout portions of the thin film wiring board, and a plurality of bump electrodes as external terminals formed on the side opposite to the chip bearing surface of the thin film wiring board.

According to this construction, since the sealing end portions as a part of the sealing portion are mainly disposed in the peripheral edge portion of the semiconductor device, a blade mainly cuts the molding resin at the time of dicing after block molding.

Consequently, it is possible to prevent peeling between the sealing portion and the thin film wiring portion, i.e., peeling between the molding resin and the thin film wiring board, during dicing. As a result, it is possible to improve the quality of the semiconductor device obtained.

In another aspect of the present invention there is provided a semiconductor device comprising a thin film wiring board which supports a semiconductor chip, with cutout portions being formed in corner portions of the thin film wiring board, and which is deformable following shrinkage on curing of a molding resin, a conductive member for connecting each surface electrode on the semiconductor chip with the thin film wiring board, a sealing portion which is constituted by the molding resin and which seals the semiconductor chip and the conductive member with resin, the sealing portion having a sealing body portion formed on a chip bearing surface of the thin film wiring board and sealing end portions located in the cutout portions of the thin film wiring board, and a plurality of bump electrodes as external terminals formed on the side opposite to the chip bearing surface of the thin film wiring board.

According to this construction, since sealing end portions as a part of the sealing portion are located at corner portions of the semiconductor device, the blade cuts only the molding resin at corner portions where peeling of the substrate is apt to occur during dicing.

During dicing, therefore, it is possible to prevent peeling of the substrate, i.e., peeling between the molding resin and the thin film wiring board, at corner portions, so that it is possible to improve the quality of the semiconductor device.

In a further aspect of the present invention there is provided a semiconductor device comprising a thin film wiring board which supports a semiconductor chip, with thin-walled portions being formed in peripheral edge portions of the thin film wiring board, and which is deformable following shrinkage on curing of a molding resin, a conductive member for connecting each surface electrode on the semiconductor chip with the thin film wiring board, a sealing portion which is constituted by the molding resin and which seals the semiconductor chip and the conductive member with resin, the sealing portion having a sealing body portion formed on a chip bearing surface of the thin film wiring board and sealing end portions bonded to the thin-walled portions of the thin film wiring board, and a plurality of bump electrodes as external terminals formed on the side opposite to the chip bearing surface of the thin film wiring board.

In a still further aspect of the preset invention there is provided a semiconductor device manufacturing method comprising the steps of providing a thin film wiring board which is deformable following shrinkage on curing of a molding resin and which has a plurality of partitioned device areas, mounting semiconductor chips respectively on the device areas, connecting surface electrodes on the semiconductor chips with corresponding electrodes in the device areas by means of conductive members, sealing the semiconductor chips and the conductive members with resin so as to cover the plural device areas in a lump on the chip bearing surface side of the thin film wiring board, thereby forming a sealing portion, and causing a cutting blade to advance toward the sealing portion from the thin film wiring board side to divide the wiring board device area by device area in accordance with a down cutting method.

In a still further aspect of the present invention there is provided a semiconductor device manufacturing method comprising the steps of providing a thin film wiring board which is deformable following shrinkage on curing of a molding resin and which has a plurality of partitioned device areas, mounting semiconductor chips respectively on the device areas, connecting surface electrodes on the semiconductor chips with corresponding electrodes in the device areas by means of conductive members, sealing the semiconductor chips and the conductive members with resin so as to cover the plural device areas in a lump on the chip bearing surface side of the thin film wiring board, thereby forming a sealing portion, and dividing the thin film wiring board device area by device area with a cutting blade in two stages in the first stage of which the blade advances in a direction parallel to one arrangement direction of the device areas on the thin film wiring board and in the second stage of which the blade advances in a direction perpendicular thereto.

In a still further aspect of the present invention there is provided a semiconductor device manufacturing method comprising the steps of providing a thin film wiring board which is deformable following shrinkage on curing of a molding resin and which has a plurality of device areas partitioned by partition lines, the partition lines serving also as cutting allowances, mounting semiconductor chips respectively on the device areas, connecting surface electrodes on the semiconductor chips with corresponding electrodes in the device areas by means of conductive members, sealing the semiconductor chips and the conductive members with resin so as to cover the plural device areas in a lump on the chip bearing surface side of the thin film wiring board, thereby forming a sealing portion, and causing a cutting blade to advance from the thin film wiring board side and move along the cutting allowances to divide the wiring board device area by device area.

In a still further aspect of the present invention there is provided a semiconductor device manufacturing method comprising the steps of providing a thin film wiring board which is deformable following shrinkage on curing of a molding resin and which has a plurality of device areas partitioned by partition lines, with a plurality of through holes being formed in the partition lines, mounting semiconductor chips respectively on the device areas, connecting surface electrodes on the semiconductor chips with corresponding electrodes in the device areas by means of conductive members, sealing the semiconductor chips and the conductive members with resin so as to cover the plural device areas in a lump on the chip bearing surface side of the thin film wiring board, while allowing the molding resin to get into the through holes in the thin film wiring board, and causing a cutting blade to advance from the thin film wiring board side to cut the wiring board along the through holes formed in the partition lines and thereby divide the wiring board device area by device area.

In a still further aspect of the present invention there is provided a semiconductor device manufacturing method comprising the steps of providing a thin film wiring board which is deformable following shrinkage on curing of a molding resin and which has a plurality of device areas partitioned by partition lines, with through holes being formed in corner portions of the partition lines, mounting semiconductor chips respectively on the device areas, connecting surface electrodes on the semiconductor chips with corresponding electrodes in the device areas by means of conductive members, sealing the semiconductor chips and the conductive members with resin so as to cover the plural device areas in a lump on the chip bearing surface side of the thin film wiring board, while allowing the molding resin to get into the through holes in the thin film wiring board, and causing a cutting blade to advance from the thin film wiring board side to cut the wiring board along the through holes formed in the corner portions of the partition lines and thereby divide the wiring board device area by device area.

In a still further aspect of the present invention there is provided a semiconductor device manufacturing method comprising the steps of providing a thin film wiring board which is deformable following shrinkage on curing of a molding resin and which has a plurality of device areas partitioned by partition lines, with thin-walled portions being formed in the partition lines, mounting semiconductor chips respectively on the device areas, connecting surface electrodes on the semiconductor chips with corresponding electrodes in the device areas, sealing the semiconductor chips and the conductive members with resin so as to cover the plural device areas in a lump on the chip bearing surface side of the thin film wiring board, while allowing the molding resin to be placed on the thin-walled portions, and causing a cutting blade to advance from the thin film wiring board side to cut the wiring board along the thin-walled portions formed in the partition lines and thereby divide the wiring board device area by device area.

BRIEF DESCRIPTION OF THE DRAWINGS

FIGS. 1(a) and 1(b) illustrate an example of a structure of a semiconductor device (CSP) embodying the present invention, of which FIG. 1(a) is a side view and FIG. 1(b) is a bottom view;

FIGS. 4(a) and 4(b) are enlarged partial plan views each showing a structure after sealing with resin of power supply lines illustrated in a portion B in FIG. 3, of which FIG. 4(a) illustrates power supply lines according to the embodiment and FIG. 4(b) illustrates power supply lines according to a modification;

FIGS. 11(a), 11(b), 11(c), 11(d), and 11(e) illustrate an example of dicing methods capable of being adopted in the semiconductor device (CSP) manufacturing method embodying the invention, of which FIG. 11(a) is a partial plan view showing dicing lines on a multi device substrate, FIG. 11(b) illustrates a down cutting method, FIG. 11(c) is an enlarged partial side view showing a portion C in FIG. 11(b), FIG. 11(d) illustrates an up cutting method, and FIG. 11(e) is an enlarged partial side view showing a portion C in FIG. 11(d);

FIGS. 12(a) and 12(b) show an example of blade moving paths in the dicing illustrated in FIG. 11, of which FIG. 12(a) is a partial plan view showing a first-stage of cutting and FIG. 12(b) is a partial plan view showing a second-stage of cutting;

FIGS. 16(a) and 16(b) illustrate the structure of a CSP according to a modification of the semiconductor device (CSP) embodying the invention, of which FIG. 16(a) is a side view and FIG. 16(b) is a bottom view;

FIGS. 17(a) and 17(b) illustrate the structure of a CSP according to a modification of the semiconductor device (CSP) embodying the invention, of which FIG. 17(a) is a bottom view and FIG. 17(b) is a sectional view taken along line F—F in FIG. 17(a);

FIGS. 18(a) and 18(b) are enlarged partial sectional views illustrating the structure of a portion G shown in FIG. 17(b), of which FIG. 18(a) illustrates the structure of a convex portion and FIG. 18(b) illustrates the structure of a concave portion;

FIG. 20(a) is a sectional view taken along line A—A in FIG. 19 and FIG. 20(b) is a sectional view taken along line B—B in FIG. 19.

DETAILED DESCRIPTION OF PREFERRED EMBODIMENTS

Figure 1A:
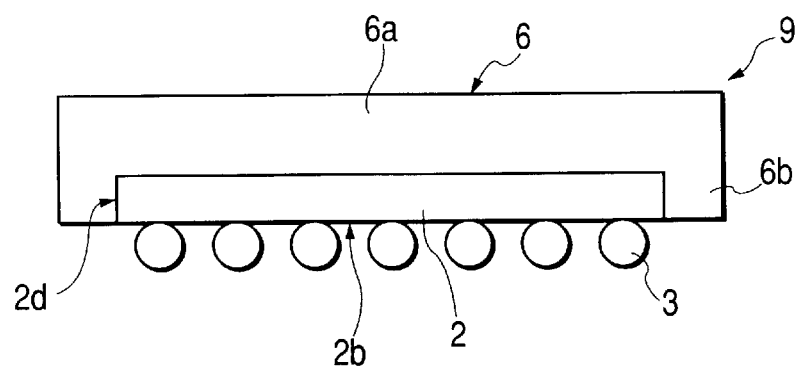

Embodiments of the present invention will be described hereinunder with reference to the drawings. In all of the drawings for illustrating the embodiments, components having the same functions are identified by the same reference numerals, and repeated explanations thereof will be omitted.

Figure 1B:
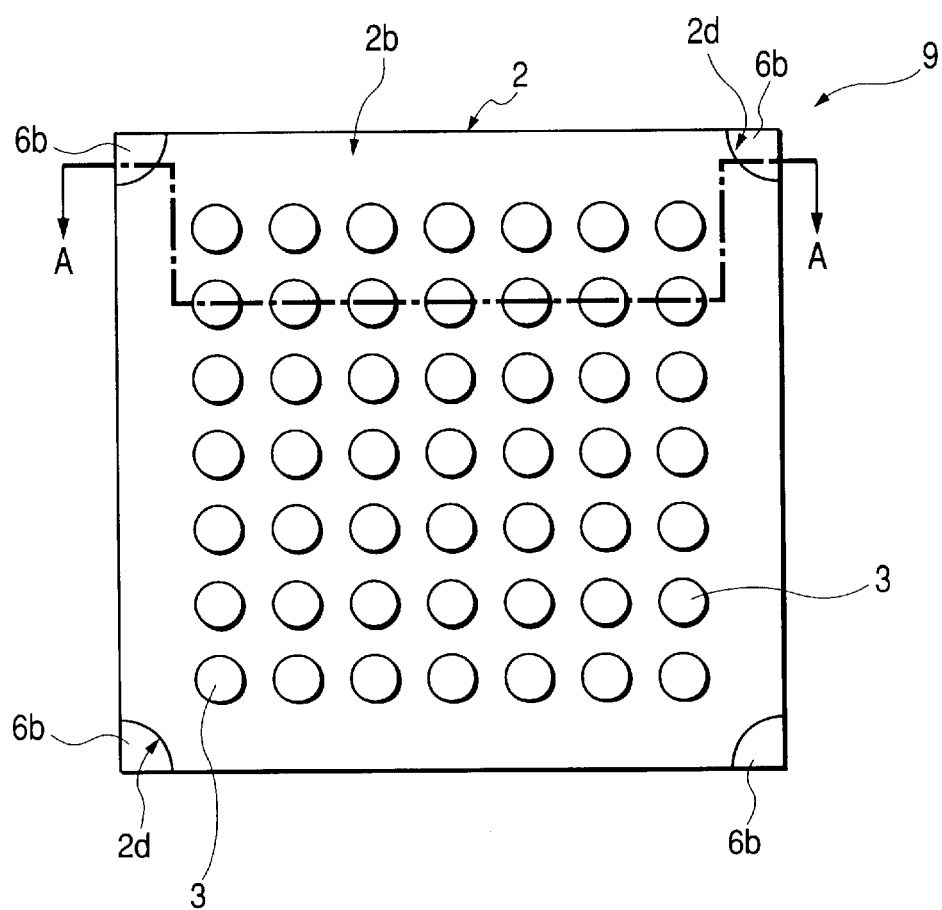
Figure 2:
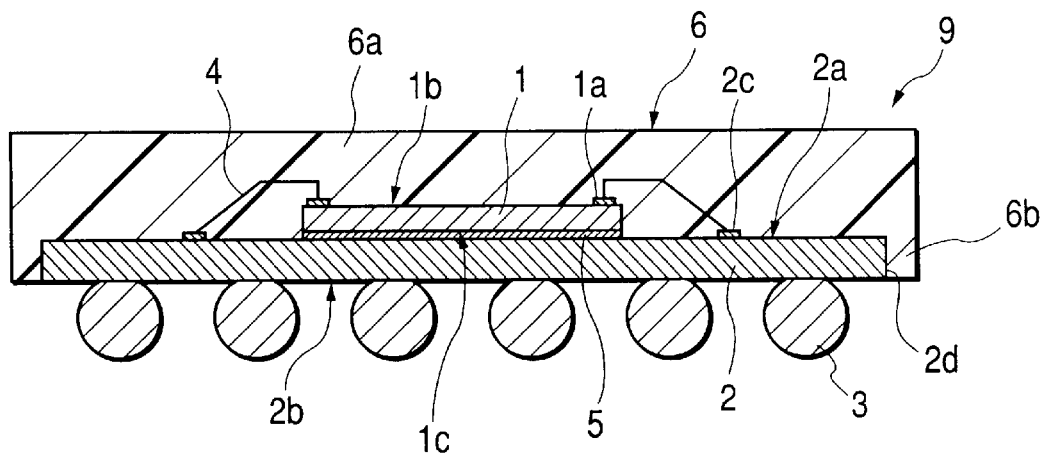
FIG. 2 is a sectional view showing the structure of a section taken along line A—A in FIG. 1(b)

Referring to FIGS. 1 and 2 there is illustrated a semiconductor device embodying the present invention, in which a film substrate 2 as a thin film wiring board supports a semiconductor chip 1. As the semiconductor device, reference will be made below to a CSP 9 which is a semiconductor package of the chip size or a littler larger size with the semiconductor chip 1 being sealed with resin by molding on a chip bearing surface 2a side of the film substrate 2.

On the side (hereinafter referred to as "back side") opposite to the chip bearing surface 2a of the film substrate 2 there are provided plural solder balls (bump electrodes) 3 as external terminals in a matrix array, as shown in FIGS. 1(a) and 1(b). The semiconductor device of such a structure is called an area array type semiconductor device.

Figure 3:
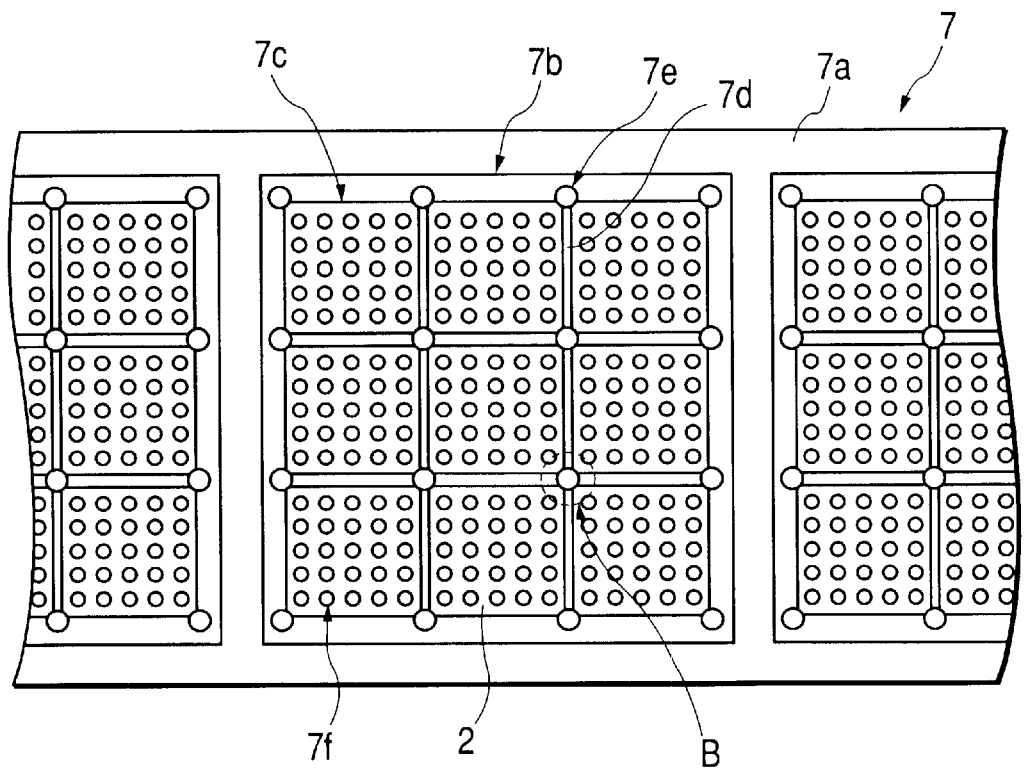
FIG. 3 is an enlarged partial plan view showing an example of a structure of a multi device substrate used in manufacturing the CSP shown in FIG. 1.

In the CSP 9 of this embodiment, such a multi device substrate 7 as shown in FIG. 3 is used and is resin-molded so as to cover plural device areas 7c in a lump ("block molding" hereinafter) to afford a block molding portion 8 shown in FIG. 7, which molding portion is subjected to dicing after the molding to obtain individual pieces.

For the film substrate 2 it is desirable to take into account the reduction in thickness of the CSP 9, adhesion to the molding resin, heat resistance and anti-hygroscopic property. For example, a thin film wiring board formed by a polyimide tape is preferred.

Thus, as the film substrate 2 there is used a flexible one which is deformable following shrinkage on curing of a molding resin and which can relieve an internal stress induced within the package during manufacture.

Such a film substrate 2 permits a predetermined amount of warp (L indicated in FIG. 13) of the CSP 9.

A description will now be given about the structure of the CSP 9 of this embodiment. The CSP 9 is made up of the film substrate 2 which supports the semiconductor chip 1 and which has such arcuate cutout portions 2d as shown in FIG. 1(b) formed in four corners of peripheral edge portions, wires (conductive members) 4 for connecting pads 1a as surface electrodes on the semiconductor chip 1 shown in FIG. 2 with corresponding connecting terminals 2c on the film substrate 2, a sealing portion 6 which is constituted by a molding resin and which seals the semiconductor chip 1 and the wires 4 with resin, the sealing portion 6 having a sealing body portion 6a formed on the chip bearing surface 2a of the film substrate 2 and sealing end portions 6b located in the cutout portions 2d of the film substrate 2, and plural solder balls 3 as bump electrodes formed as external terminals in a matrix array on the back side 2b of the film substrate 2.

Therefore, as shown in FIG. 1(b), the back side 2b of the film substrate 2 is exposed with the sealing end portions 6b bonded to the circular cutout portions 2d in the four corners of the back side 2b.

Figure 7:
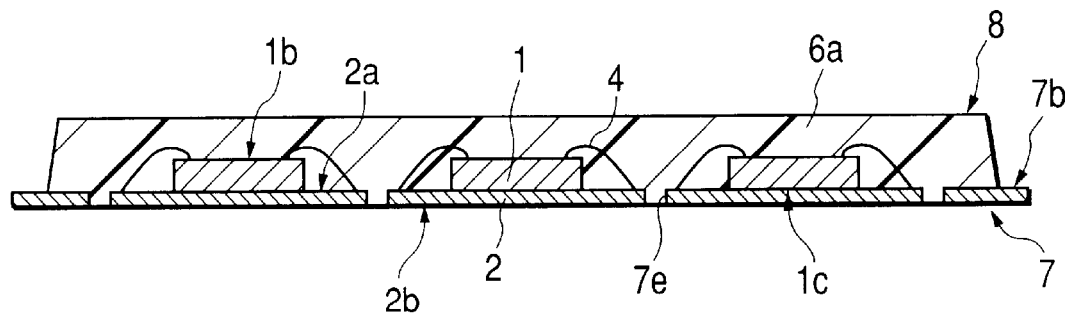
FIG. 7 is a sectional view showing an example of a block molding state in the semiconductor device (CSP) manufacturing method embodying the invention.
Figure 9:
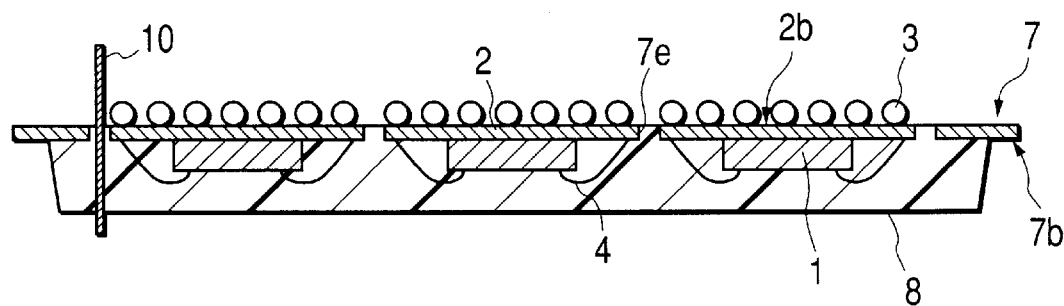
FIG. 9 is a sectional view showing an example of a dicing state in the semiconductor device (CSP) manufacturing method embodying the invention.

Thus, at the time of dicing performed after the block molding portion 8 shown in FIG. 7 has been formed by the block molding, only the sealing end portions 6b formed by the molding resin are present in the corners of each device area 7c on the multi device substrate 7, so that only the molding resin is cut in the corners by means of a blade 10 shown in FIG. 9 and there occurs no internal stress because the flexible substrate 2 warps. Consequently, it is possible to prevent the occurrence of substrate peeling which is peeling of the film substrate 2 from the sealing portion 6.

The molding resin used in the block molding is, for example, a thermosetting epoxy resin. In molding using the molding resin, the sealing body portion 6a and the sealing end portions 6b are formed integrally as the sealing portion 6.

The semiconductor chip 1 is formed of silicon for example and on a main surface 1b thereof is formed a semiconductor integrated circuit, while on peripheral edge portions of the main surface 1b are formed plural pads 1a as surface electrodes.

As shown in FIG. 2, using a die bonding material 5 such as an epoxy bonding material, the semiconductor chip 1 is fixed to a nearly central position of the chip bearing surface 2a of the film substrate 2.

The wires 4, for example gold wires, which are connected by wire bonding, provide connections between the pads 1a on the semiconductor chip 1 and corresponding connecting terminals 2c on the film substrate 2.

Further, plural solder balls 3 as external terminals connected in conduction with the connecting terminals 2c of the film substrate 2 are provided in a matrix layout on the back side 2b of the film substrate 2. Thus, the pads 1a on the semiconductor chip 1 and the corresponding solder balls 3 as external terminals are connected together through wires 4 and connecting terminals 2c and further through intra-substrate wiring lines.

In the multi device substrate 7 shown in FIG. 3, circular through holes 7e are formed respectively in the corners of each device area 7c which is square in shape, and the film substrate 2 is cut along the through holes 7e at the time of dicing after the block molding, whereby the arcuate cutout portions 2d are formed in the corners of the film substrate 2.

The following description is now provided about a semiconductor device (CSP 9) manufacturing method embodying the present invention.

According to the CSP 9 manufacturing method of this embodiment, using the multi device substrate 7 shown in FIG. 3 which comprises plural film substrates 2 linked together in a matrix array, the plural partitioned device areas 7c are covered in a lump with resin by molding and are then divided into individual device areas, or CSPs 9, by dicing.

Each film substrate 2 is a thin film wiring board capable of being deformed following shrinkage on curing of the molding resin.

First, a semiconductor chip 1 with a desired semiconductor integrated circuit formed on a main surface 1b thereon is provided.

On the other hand, the multi device substrate 7 shown in FIG. 3 is provided. The multi device substrate 7 comprises film base substrates 7b and a frame portion 7a which supports the film base substrates 7b, the film base substrates 7b comprising a certain number (corresponding to the device areas 7c; nine in this embodiment, provided the number is not specially limited) of film substrates 2 as thin film wiring boards formed in a partitioned matrix array.

More specifically, in the multi device substrate 7 of this embodiment, plural film base substrates 7b are affixed to the frame portion 7a formed of copper for example, the film base substrates 7b each comprising nine film substrates 2 arranged in a 3 rows×3 columns matrix array and partitioned by dicing lines (partition lines) 7d. A block molding is performed for each film base substrate 7b in the multi device substrate, whereby there is formed a block molding portion 8 shown in FIG. 7 which corresponds to the film base substrate 7b.

Each film base substrate 7b is formed by a thin polyimide tape or the like, that is, it possesses a sufficient flexibility, thus permitting a desired warp which occurs during manufacture of the semiconductor device.

Figure 4A:
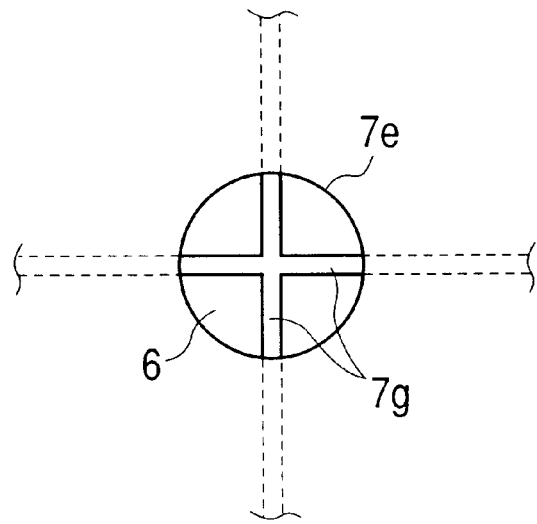

In each film base substrate 7b, circular through holes 7e are formed respectively in corner portions of each film substrate 2 which is a partitioned square device area 7c, and power supply lines 7g are exposed crosswise in each through hole 7e, as shown in FIG. 4(a).

The power supply lines 7g are copper wires which are supplied with electric power at the time of plating wiring patterns in the manufacture of the film base substrate 7b, and are become unnecessary after the plating for wiring patterns on the film substrate 2 is over. In the case of the power supply lines 7g shown in FIG. 4(a), they are formed along the dicing lines 7d shown in FIG. 3 and are therefore cut and removed at the time of dicing after the block molding.

In the case of the power supply lines 7g shown in FIG. 4(a), during the block molding, the molding resin gets into each of the through holes formed in the film base substrate 7b from a gap present around the crossed power supply lines 7g in the through hole 7e to form a molding portion 6 also in the through hole, so that the sealing portion 6 becomes a sealing end portion 6b when the constituent film substrates of each film base substrate 7b are divided into individual pieces by dicing.

Figure 4B:
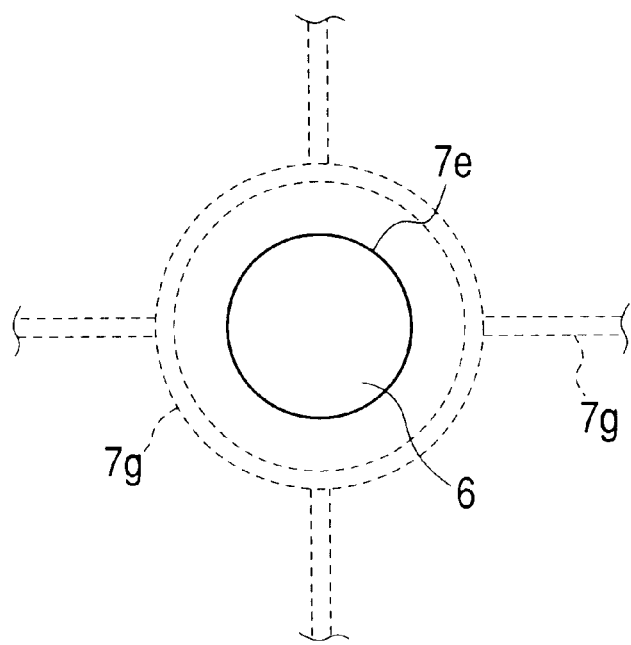

FIG. 4(b) shows the shape of a modified example of power supply lines 7g, in which a circular power supply line 7g is formed around the through hole 7e in a lightly spaced relation thereto.

In the case of the power supply lines 7g according to the modified example shown in FIG. 4(b), since the power supply lines 7g are not located in the through hole 7e, the molding resin gets into the through hole 7e to form a sealing portion 6 in the block molding, which sealing portion 6 becomes a sealing end portion 6b when the constituent film substrates of each film base substrate are divided into individual pieces by dicing. Therefore, in each of the thus-divided CSPs 9, a portion of the molding resin cured in the through hole 7e at each corner portion of the CSP is formed as a sealing end portion 6b, but slightly inside thereof there remains only the circular power supply line 7g.

Thus, with the circular power supply line 7g disposed around the through hole 7e, a resin-resin bonded area of a strong bonding force wherein the film substrate 2 and the sealing portion 6 are directly bonded together can be ensured in the area between the circular power supply line 7g and the through hole 7e, so that the resistance to substrate peeling is further improved in comparison with the case of FIG. 4(a) in which power supply lines 7g are disposed along the crossing portions of the dicing lines 7d and an end portion of the through hole 7e to form a resin-metal-resin bonded area.

Figure 19:
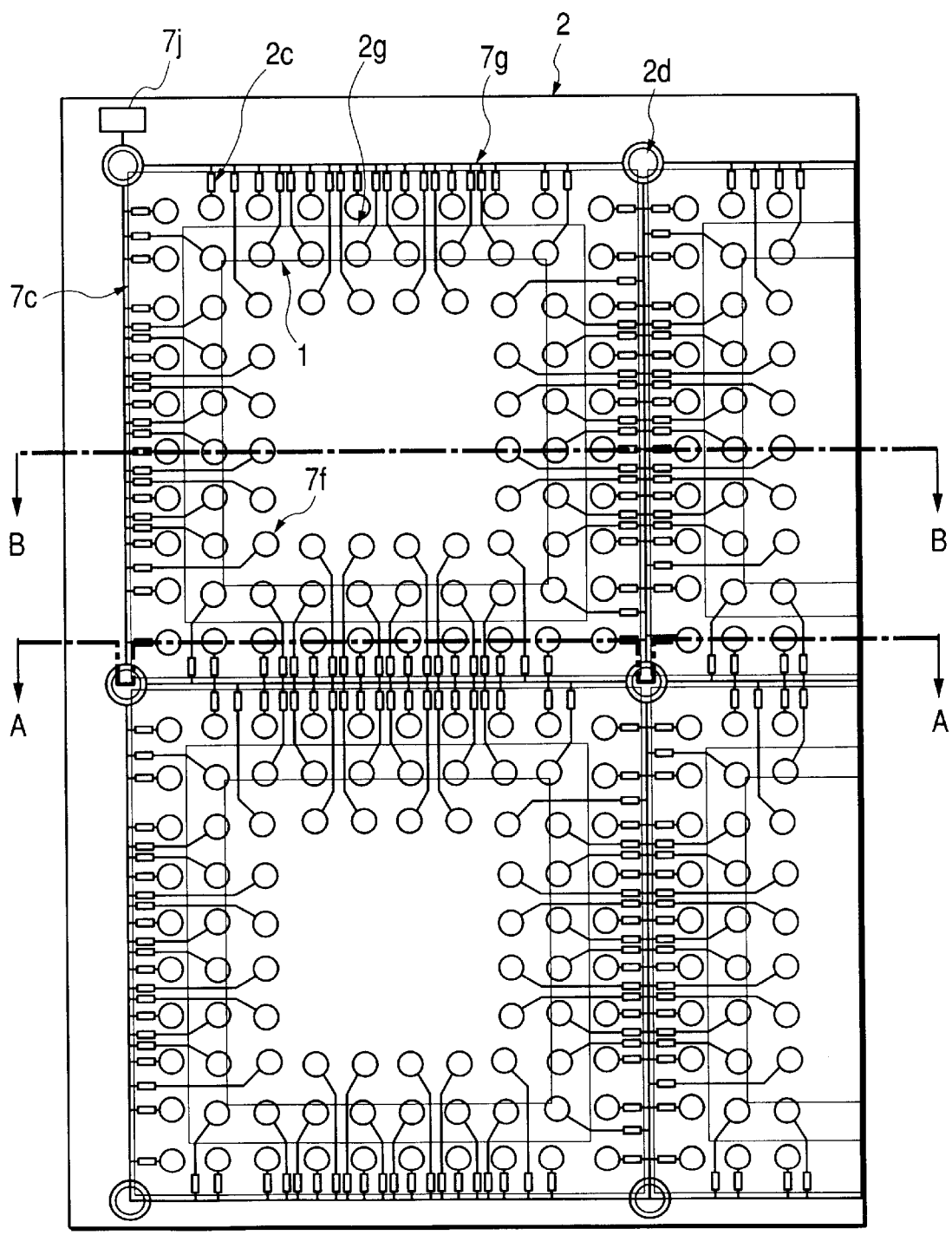
FIG. 19 is a plan view showing a modified example of a ball bonding state.

As shown in FIG. 19, the power supply lines 7g are connected to an electroplating power-supply electrode 7j.

In each device area 7c of each film base substrate 7b there are mounted plural bump lands 7f in a matrix array which can mount thereon the solder balls 3 shown in FIG. 2.

Figure 5:
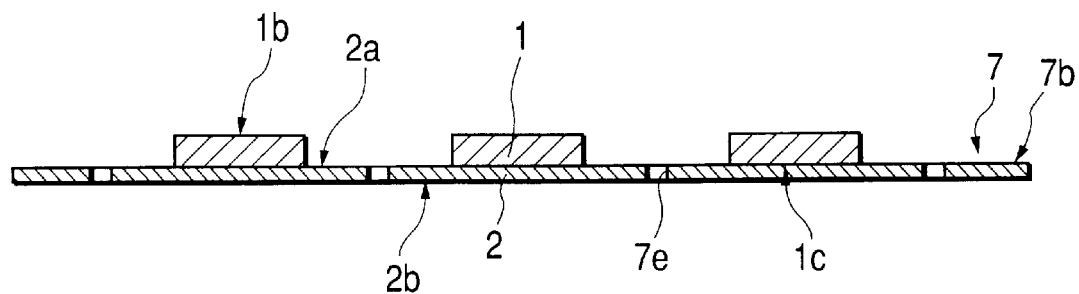
FIG. 5 is a sectional view showing an example of a die bonding state in the semiconductor device (CSP) manufacturing method embodying the invention.

Subsequently, the die bonding material 5 shown in FIG. 2 is applied to a nearly central portion of each film substrate 2 having the associated device area 7c on each film base substrate 7b in the multi device substrate 7 and die bonding (also called chip mounting) is performed for mounting the semiconductor chip 1 shown in FIG. 5.

In this embodiment, the semiconductor chip 1 is placed on the die bonding material 5, followed by heating to bond the die bonding material 5 and a back side 1c of the semiconductor chip 1 with each other.

Figure 6:
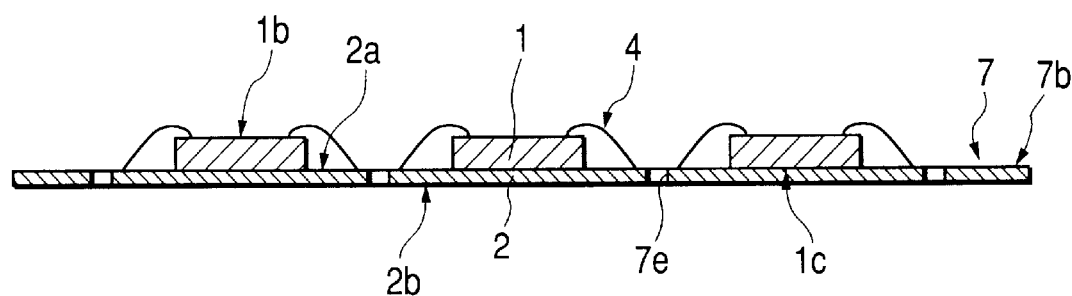
FIG. 6 is a sectional view showing an example of a wire bonding state in the semiconductor device (CSP) manufacturing method embodying the invention.

Thereafter, the pads 1a (see FIG. 2) as surface electrodes formed on the peripheral edge portions of the main surface 1b of the semiconductor chip and the corresponding connecting terminals 2c (electrodes) formed on the film substrate 2 and shown in FIG. 2 are connected together by wire bonding using wires 4 (conductive members) such as gold wires, as shown in FIG. 6.

After the wire bonding, resin-sealing is performed by a block transfer molding to form such a block molding portion 8 as shown in FIG. 7.

More specifically, on the chip bearing surface 2a side of the constituent film substrates 2 of each film base substrate 7b in the multi device substrate 7, the molding resin is allowed to cure so as to cover the plural device areas 7c shown in FIG. 3 in a lump to form the block molding portion 8, thereby sealing the semiconductor chips on the film substrates 2 and the wires 4 with the molding resin.

As the molding resin there is used, for example, a thermosetting epoxy resin.

For the molding, first the multi device substrate 7 shown in FIG. 3 is set into a mold and the molding resin is fed into a cavity of the mold, allowing the molding resin to be charged into the cavity.

In this case, the molding resin gets into the through holes 7e formed in the corners of each device area 7c in the multi device substrate 7 to form sealing portions 6 also within the through holes 7e, as shown in FIG. 4.

As a result, on the back side 2b of each film substrate 2 in the multi device substrate 7, the sealing portions 6 formed in the through holes 7e are exposed.

Since the sealing portions 6 are formed in the through holes 6e by the molding resin, it is possible to enhance the bonding force between the molding resin and the film substrate 2.

Figure 8:
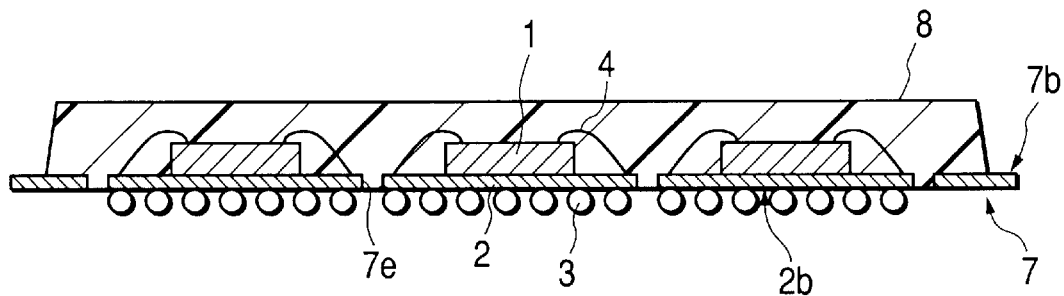
FIG. 8 is a sectional view showing an example of a ball bonding state in the semiconductor device (CSP) manufacturing method embodying the invention.

Thereafter, as shown in FIG. 8, solder balls 3 as external terminals are affixed to the back side 2b of each film substrate 2 in the multi device substrate 7.

To be more specific, solder balls 3 are affixed, for example by a transfer method, to the bump lands 7f of each film substrate 2 shown in FIG. 3.

It is optional whether the mounting of solder balls 3 is to be done before or after dicing which follows the block molding.

In case of bonding solder balls before dicing, the solder balls can be affixed in a lump to plural bump lands 7f, so the time required for the solder ball bonding work can be shortened; besides, since the solder ball bonding work is done before dicing, it is possible to prevent stain of the bump lands 7f and hence possible to prevent the entry of a foreign matter into bonded portions between the bump lands 7f and the solder balls 3.

On the other hand, in case of performing the solder ball bonding work after dicing, a film sheet or the like is affixed to the back side 2b of each film substrate 2 in the multi device substrate 7 after the block molding and dicing is performed while taking care so as not to stain the bump lands 7f, thereafter, the film sheet is peeled off and the solder ball bonding is performed by the foregoing transfer method for example.

Thus, according to the procedure of performing the solder ball bonding work after dicing, the solder balls 3 are not stained, so that a ball washing step after the mounting of solder balls can be omitted or simplified.

In a dicing step which follows, as shown in FIG. 9, the multi device substrate 7 is turned upside down so that the back side 2b thereof faces up, and the block molding portion 8 is cut with the blade 10 to divide the multi device substrate into individual film substrates 2.

Figure 11A:
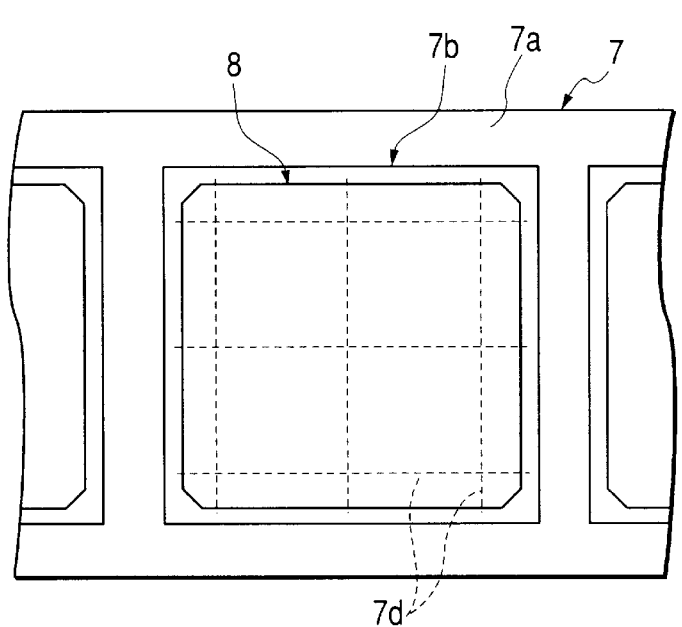
Figure 11B:
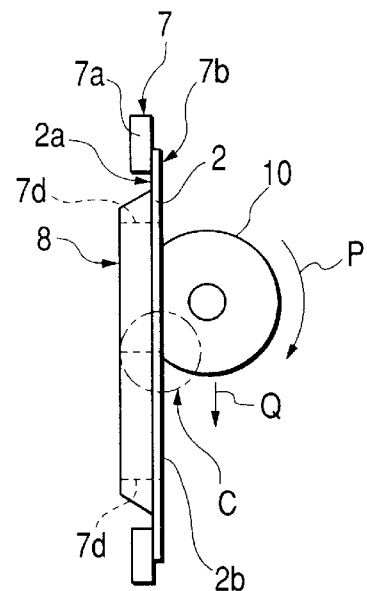
Figure 11C:
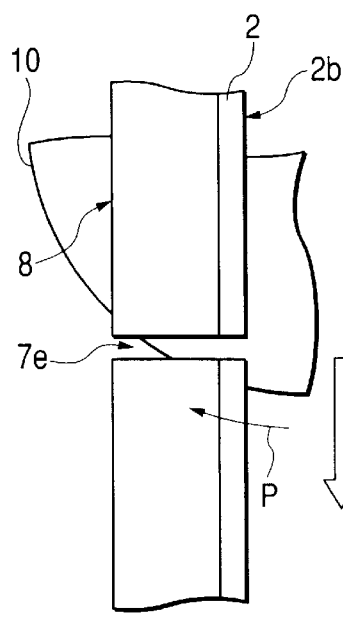

At the time of dicing, as shown in FIGS. 11(b) and 11(c), it is preferable that the cutting blade 10 be allowed to advance into the multi device substrate 7 from the back side 2b of the film substrates 2, not from the block molding portion 8 side located on the surface side of the multi device substrate 7, to divide the multi device substrate device area 7c (see FIG. 3) by device area (formation of individual substrates) by a down cutting method.

During the cutting work, the blade 10 is moved along the dicing lines 7d formed as partition lines on film base substrate 7b concerned and through the through holes 7e formed in corner portions of each device area 7c.

According to the down cutting method, as shown in FIG. 11(b), the blade 10 moves from above to below and cuts the multi device substrate 7 while rotating (in the direction of P), cutting into the multi device substrate, and advancing (in the direction of Q) so as to push the film base substrate 7b concerned in the multi device substrate against the block molding portion 8.

Figure 11D:
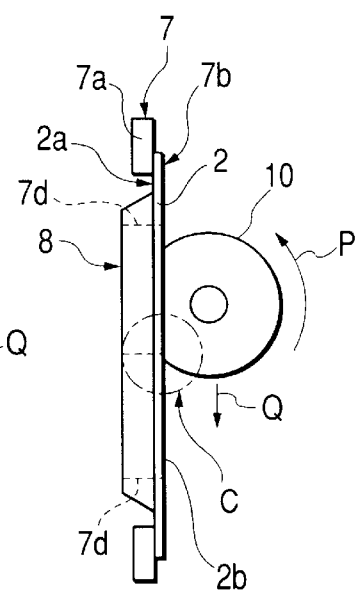
Figure 11E:
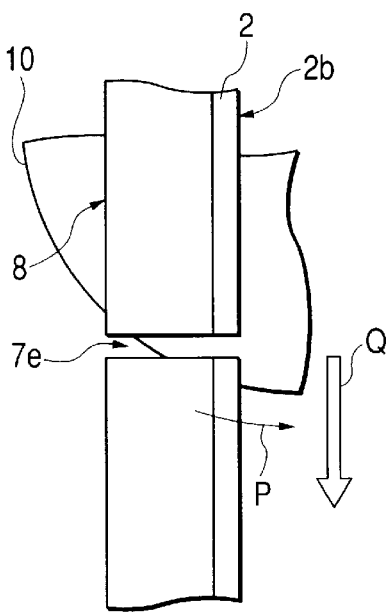

According to the up cutting method reverse to the down cutting method, as shown in FIGS. 11(d) and 11(e), the multi device substrate 7 is cut while causing the blade 10 to rotate, cut into the substrate, and advance so as to let the film base substrate 7b to jump up to the side opposite to the block molding portion 8 side.

As shown in FIG. 11(a), by performing the cutting work along the dicing lines 7d on the film base substrate 7b in accordance with the foregoing down cutting method, it is possible to prevent substrate peeling, i.e., peeling between each film substrate 2 and the sealing portion 6 (block molding portion 8), in the dicing work.

During the cutting work, moreover, by causing the blade 10 to move along the dicing lines 7d and through the through holes 7e formed in the corner portions of each device area 7c, it is possible to remove the power supply lines 7g shown in FIG. 4. Further, as is seen from the CSP 9 in FIG. 1, arcuate cutout portions 2d are formed respectively in the corner portions of each film substrate 2 and sealing end portions 6b bonded to the cutout portions 2d of the film substrate 2 and integral with the sealing portion 6 can be disposed in peripheral edge corners of the CSP 9.

Figure 10:
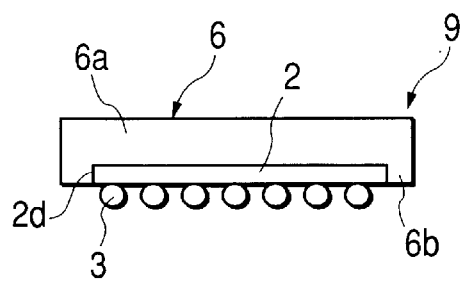
FIG. 10 is a side view showing an example of a structure of a CSP obtained as a single piece by the dicing illustrated in FIG. 9.

By conducting a predetermined inspection after the end of dicing it is possible to complete the fabrication of such a CSP 9 as shown in FIG. 10.

In the case where solder ball bonding is performed before dicing, washing of the solder balls 3 is conducted in the substrate-divided state after dicing.

According to the semiconductor device (CSP 9) and the method for manufacturing the same according to this embodiment there are obtained the following functions and effects.

In the CSP 9 shown in FIGS. 1 and 2, cutout portions 2d are formed in peripheral edge corners of each film substrate 2 and sealing end portions 6b of the sealing portion 6 are disposed respectively in the cutout portions 2d, that is, sealing end portions 6b as part of the sealing portion 6 are disposed in the corners of the CSP 9, i.e., in the corners of each device area 7c in the film base substrate 7b, so that in the corner portions where substrate peeling is apt to occur at the time of dicing the blade 10 cuts only the molding resin without cutting the film base substrate 7b (provided the frame portion 7a is partially cut).

Consequently, it is possible to prevent the occurrence of substrate peeling, i.e., peeling between the molding resin and each thin film wiring board, in the corners of each device area 7c in the film base substrate 7b at the time of dicing, whereby it is possible to improve the quality of CSP 9.

Moreover, in the fabrication of CSP 9, using the multi device substrate 7 having plural film substrates 2 capable of being deformed following shrinkage on curing of the molding resin, the cutting blade 10, at the time of dicing, is allowed to cut into multi device substrate 7 not from the block molding portion 8 side but from the back side 2b of the multi device substrate 7 to divide the substrate device area 7c by device area in accordance with the down cutting method alone. Thus, the cutting work is performed while pushing each film substrate 2 against the sealing portion 6, so that like the foregoing it is possible to prevent the occurrence of peeling between the molding resin and the thin film wiring board during dicing.

As a result, it is possible to improve the quality and yield of CSP 9.

In the CSP 9 of this embodiment, the film substrate 2 as a flexible thin film substrate formed of polyimide is used as the wiring board which supports the semiconductor chip 1 and therefore the CSP 9 premises that the film substrate 2 warps in a certain allowable range.

Now, with reference to FIG. 13, a description will be given below about an allowable range of warp of the CSP 9 according to this embodiment.

Figure 13:
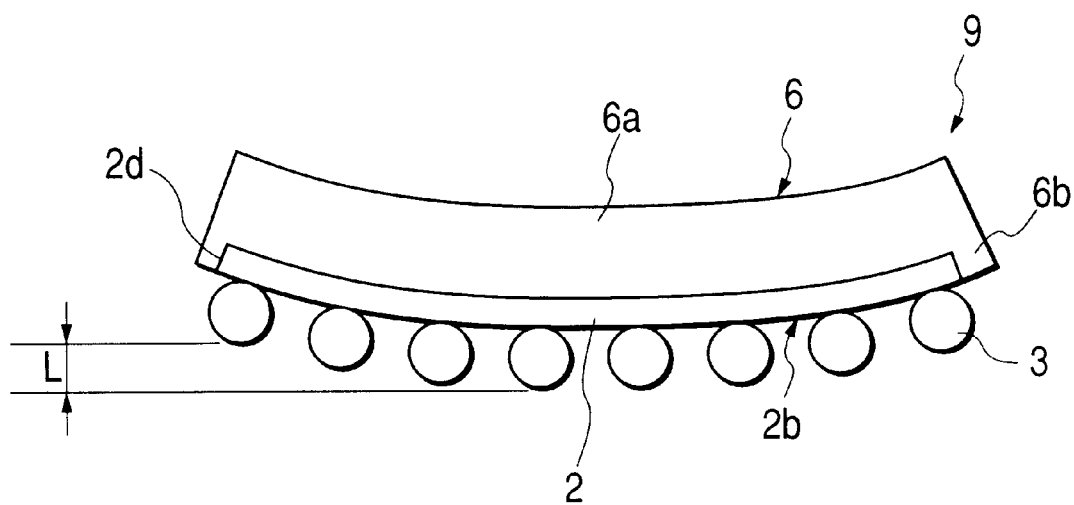
FIG. 13 is a side view showing an example of a warp allowable range of the CSP illustrated in FIG. 1.

For example, given that the mounting pitch of solder balls 3 is 0.8 mm and that the ball diameter is 0.5 mm, an allowable value of a difference (L) in height between a solder ball 3 located at the highest position and a solder ball 3 located at the lowest position, which difference results from warp of the CSP 9, i.e., a warp quantity, as shown in FIG. 13, is about 80 $\mu$m. If the warp quantity exceeds 80 $\mu$m, molten solder will leave the solder balls 3 at the time of packaging the semiconductor device by a solder reflow process and it becomes very likely that there will occur a defective packaging in which an electrical connection between a mounting substrate 12 (see FIG. 21) and the semiconductor device is not ensured.

For this reason, in the CSP 9 of this embodiment, a warp quantity up to about 80 $\mu$m is allowed for the film substrate 2 in the case where the mounting pitch of solder balls 3 is 0.8 mm and the ball diameter is 0.5 mm.

However, the above warp quantity changes depending on the relation between the mounting pitch and ball diameter of the solder balls 3.

In the CSP 9, therefore, its film substrate 2 can warp and can follow shrinkage on curing of the molding resin, so package peeling caused by an internal stress does not occur.

Figure 12A:
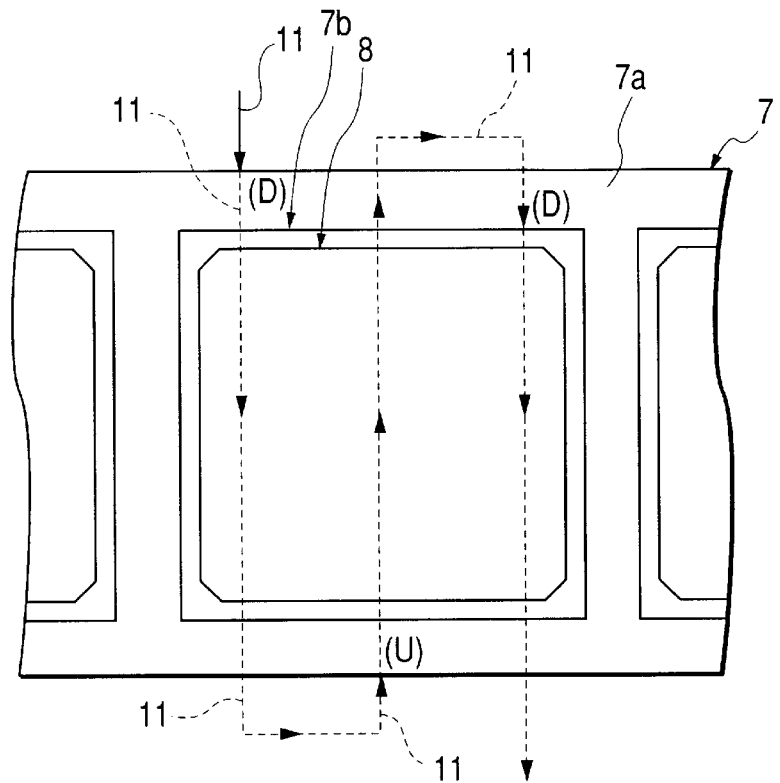
Figure 12B:
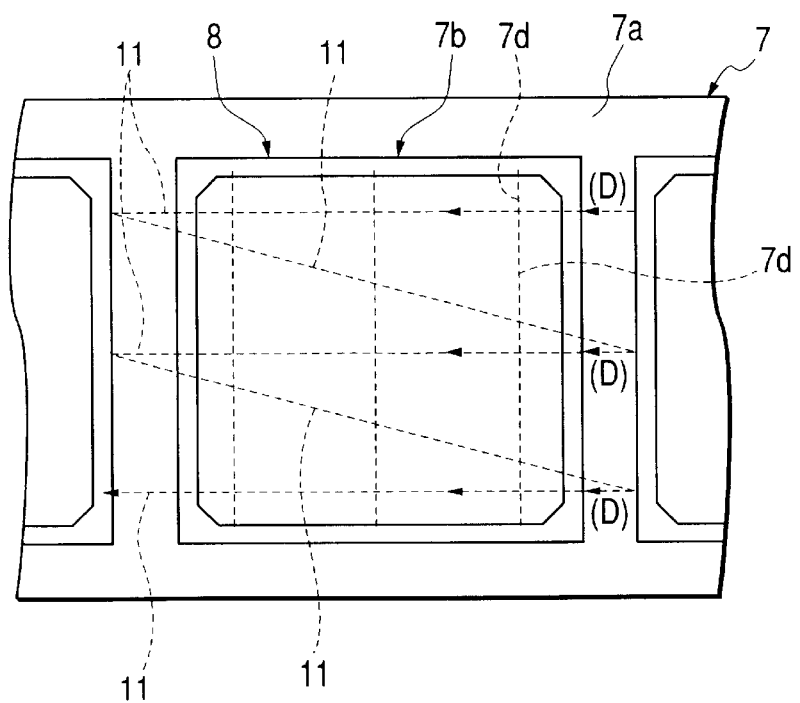

Next, the following description is provided about a method for fabricating a CSP 9 using a film substrate 2 according to a modified example, which is shown in FIGS. 12(a) and 12(b).

The modified example shown in FIGS. 12(a) and 12(b) illustrates a method capable of preventing the peeling of a film substrate 2 even in the case where through holes 7e are not formed in the film substrate at corner portions of the associated device area 7c.

Peeling of the film substrate 2 according to this modified example is prevented in the following manner. As shown in FIGS. 12(a) and 12(b), the substrate cutting with the blade 10 is performed in two first and second stages, the first stage involving cutting the multi device substrate 7 in a direction parallel to one arrangement direction of device areas 7c in the multi device substrate and the second stage involving cutting the multi device substrate 7 in a direction perpendicular to the one arrangement direction. And it is required that at least the second-stage cutting be done by the down cutting method.

In the first-stage of cutting shown in FIG. 12(a), the blade 10 is reciprocated in directions parallel to the vertical arrangement direction of device areas 7c (see FIG. 43) in the figure, whereby a movement path (dicing route) during the cutting operation of the blade 10 is made a one-stroke movement for the film base substrate 7b in the multi device substrate 7 and the film base substrate 7b is cut in both directions (from above and below in the figure).

In the first-stage cutting, as shown in FIG. 12(a), a down cutting method (D) and an up cutting method (U) are performed in an alternate manner.

More particularly, in the first stage of cutting, substrate peeling is relatively difficult to occur, so by carrying out the down cutting method (D) and the up cutting method (U) alternately it is intended to shorten a relatively distance of movement between the multi device substrate 7 and the blade 10 and thereby improve the throughput of dicing.

In the second-stage of cutting shown in FIG. 12(b), the blade 10 is moved repeatedly in a direction parallel to the lateral arrangement direction of device areas 7c (see FIG. 3) in the figure, whereby a movement path 11 (dicing route) during the cutting operation of the blade 10 is made a one-way movement with respect to the film base substrate 7b in the multi device substrate 7b and thus the film base substrate is cut in one direction (e.g., from the right to the left in the figure).

More specifically, first the blade 10 is moved from the right to the left to effect down cutting for the film base substrate 7b, then the blade 10 is once moved away from the film base substrate 7b and is placed on the right-hand side of the film base substrate, then the blade 10 is again moved from the right to the left for the film base substrate to effect down cutting. These operations of the blade 10 are repeated.

In this case, all the second-stage cutting may be done by the down cutting method (D), as shown in FIG. 12(b).

This is for the following reason. If in a damaged state of the interface between each film substrate 2 and the sealing portion 6 by the first-stage dicing the second-stage dicing is carried out across the first-stage dicing lines 7d, substrate peeling is relatively apt to occur at the crossing portions of the dicing lines 7d, so by performing all the second-stage dicing by the down cutting method it is intended to prevent the occurrence of peeling of the film substrate 2.

Thus, by dividing the cutting work for the film base substrate 7b in dicing into two stages on the basis of such controlling methods as shown in FIGS. 12(a) and 12(b) it is possible to prevent the occurrence of substrate peeling without decreasing the dicing throughput so greatly.

Next, reference will be made below to the fabrication of CSP 9 using a multi device substrate 7 of such a modified example as shown in FIG. 14.

Figure 14A:
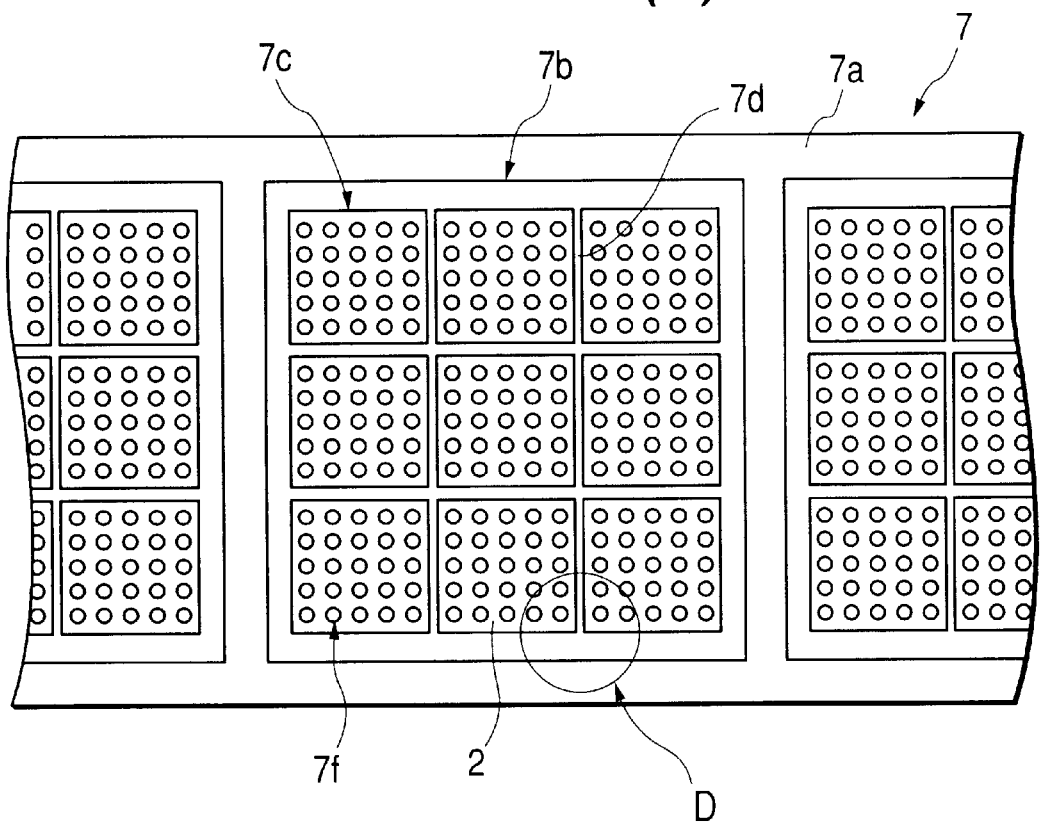
FIG. 14(a) is a partial plan view showing the structure of a modified example of a multi device substrate employable in the semiconductor device (CSP) manufacturing method embodying the invention and FIG. 14(b) is an enlarged partial plan view showing a portion D in FIG. 14(a)
Figure 14B:
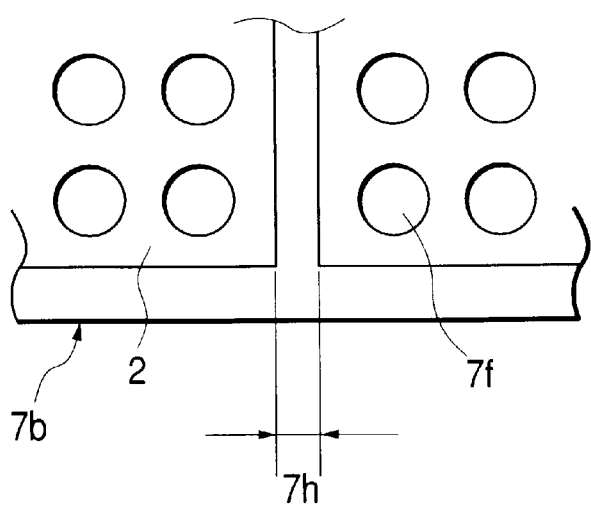

In the multi device substrate 7 of the modified example shown in FIG. 14(a) such a cutting allowance 7h as shown in FIG. 14(b) is provided on a film base substrate 7b in connection with a dicing line 7d to be used in dicing. The width of the cutting allowance 7h, i.e., dicing width, is set almost equal to the width of the blade 10. For example, if the width of the blade 10 is 200 μm (0.2 mm), the width of the cutting allowance 7h (dicing width) is also set at 200 μm.

In dicing, the blade 10 is moved along the cutting allowance 7h to divide the film base substrate 7b device area 7c by device area.

In the case of a conventional separate type of mold not for molding the device areas 7c in a lump, the cutting allowance 7h serves as a clamping allowance for a mold, which allowance is 5 to 10 mm. In this case, the number of device areas 7c included in the film base substrate 7b is about four.

Therefore, in case of using such a multi device substrate 7 as shown in FIG. 14, since it is possible to provide nine device areas 7c in the film base substrate 7b, not only the manufacturing efficiency of CSP 9 can be greatly improved, but also the cost of the substrate material can be reduced.

Figure 15A:
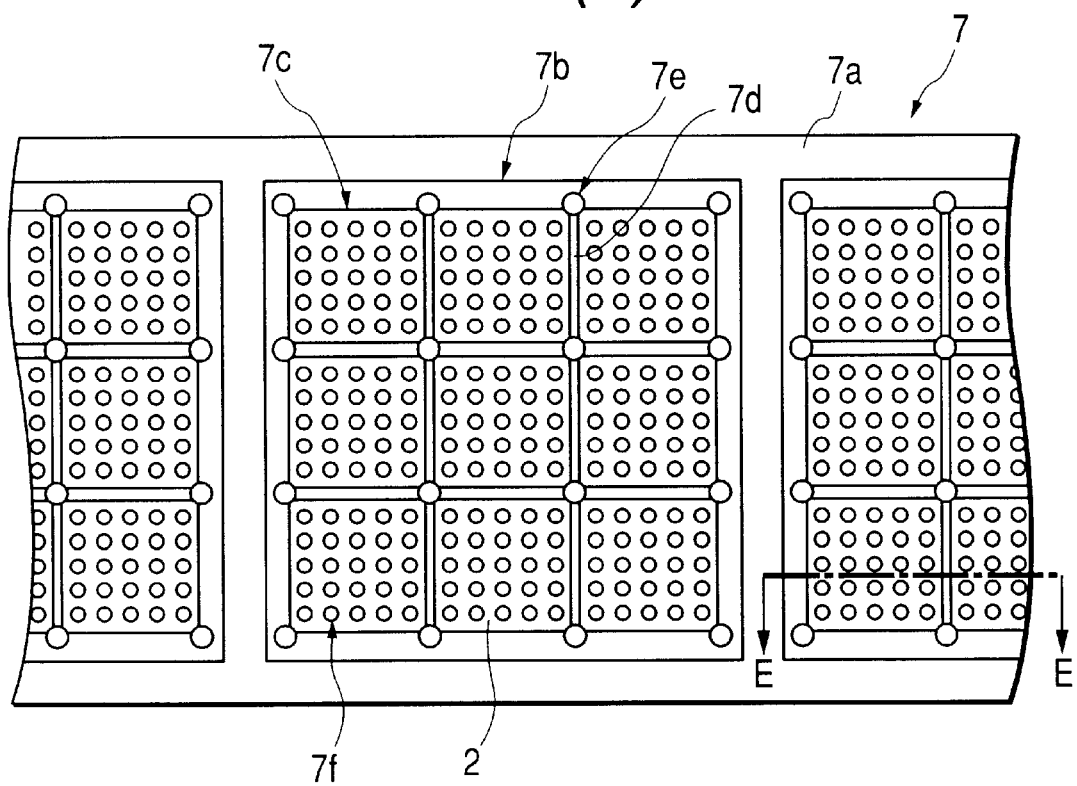
FIG. 15(a) is a partial plan view showing the structure of a modified example of a multi device substrate employable in the semiconductor device (CSP) manufacturing method embodying the invention and FIG. 15(b) is an enlarged sectional view taken along line E—E in FIG. 15(a)
Figure 15B:
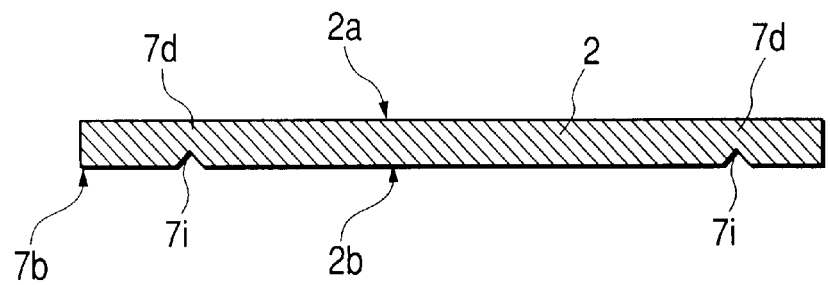

In a multi device substrate 7 of such a modified example as shown in FIG. 15(a), dicing lines 7d in peripheral edge portions of the device areas 7c in a film base substrate 7b are formed as thin-walled portions 7i thinner than in the other portion. As shown in FIG. 15(b), thin-walled portions 7i are formed along dicing lines 7d on the back side 2b of film substrates 2 in the film base substrate 7b and are tapered by a chamfering work.

At the time of dicing, therefore, by moving the blade 10 along the thin-walled portions 7i it is possible to reduce the area of contact between the film substrate 2 and the blade 10 when the film substrate is kicked up by the blade in the cutting operation, with the result that the stress imposed on the blade 10 during dicing can be diminished.

Consequently, it is possible to reduce the peeling stress on the film substrate 2 and hence possible to suppress peeling of the substrate.

By forming the thin-walled portions 7i wider than the dicing width along the dicing lines 7d there remain the thin-walled portions 7i at the peripheral edge portions of the film substrate 2 in CSP 9 after dicing.

Consequently, it is possible to suppress the substrate peeling at the peripheral edge portions of CSP 9, whereby the reliability of CSP 9 can be improved.

Figure 16A:
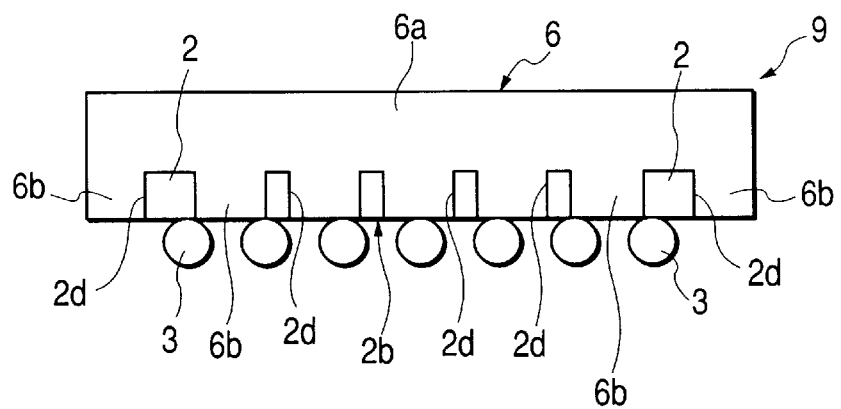
Figure 16B:
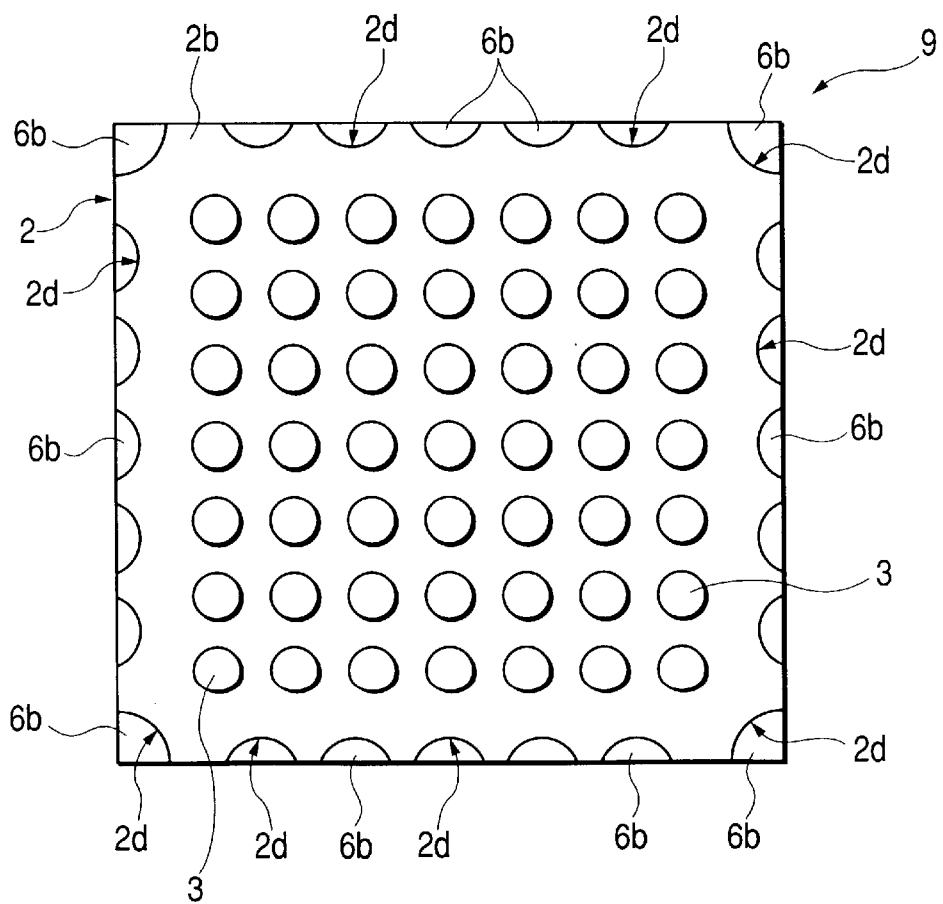

In a CSP 9 according to a modified example shown in FIG. 16, through holes 7e formed in peripheral edge portions of each device area 7c in the film base substrate 7b of the multi device substrate shown in FIG. 3 are provided not only in corner portions but also plurally throughout the whole peripheral edges of the device area 7c as shown in FIG. 16(b).

At the time of dicing, therefore, by moving the blade 10 along the plural through holes 7e formed in the dicing lines 7d it is possible to greatly decrease the area of contact between the blade 10 and the film base substrate 7b, so that the occurrence of substrate peeling during dicing can be prevented more positively.

More specifically, in the CSP 9 according to the modified example shown in FIG. 16, plural arcuate cutout portions 2d are formed in peripheral edges of the film substrate 2 and sealing end portions 6b of a sealing portion 6 are disposed respectively in the plural arcuate cutout portions 2d.

Thus, since the sealing end portions 6b as part of the sealing portion 6 are mainly disposed in the peripheral edges of the CSP 9, the blade 10 mainly cuts the molding resin at the time of molding after the block molding.

Accordingly, it is possible to prevent peeling between the sealing portion 6 formed of the molding resin and the film base substrate 7b, i.e., peeling between the molding resin and the each film substrate 2, during dicing.

As a result, it is possible to improve the quality of CSP 9.

Figure 17A:
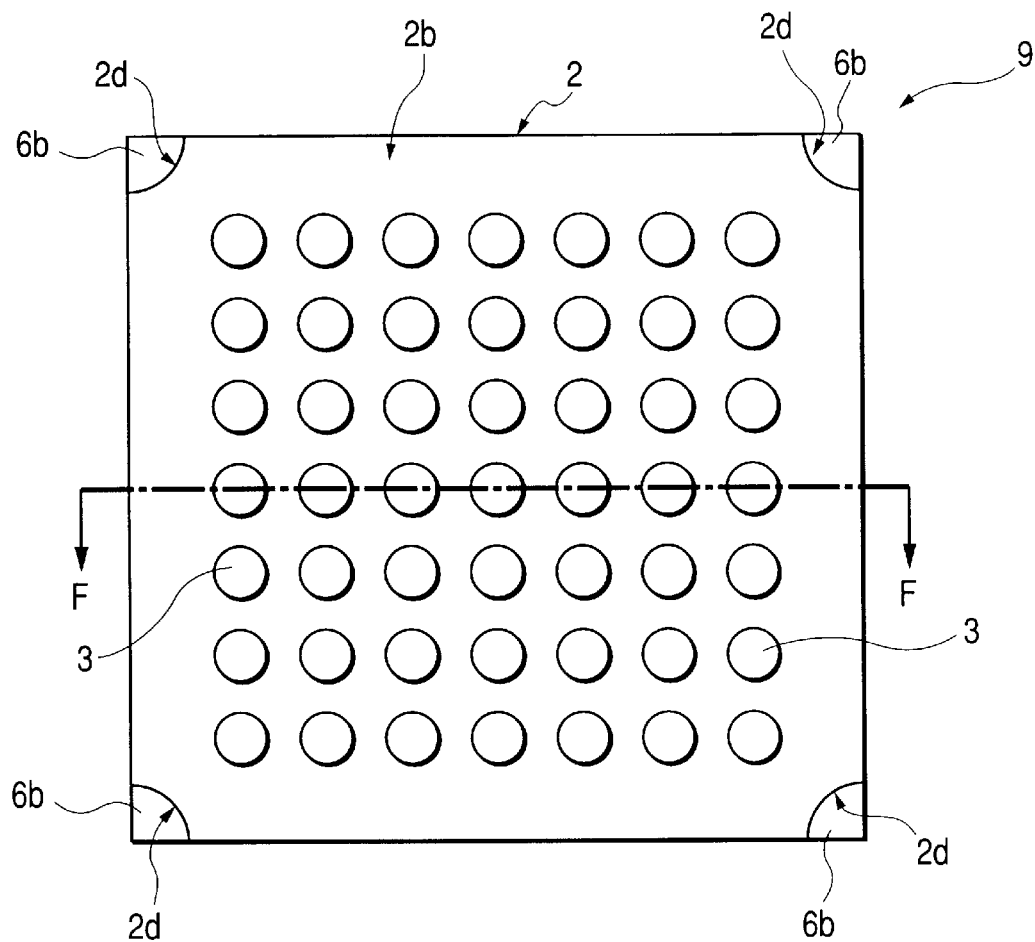
Figure 17B:
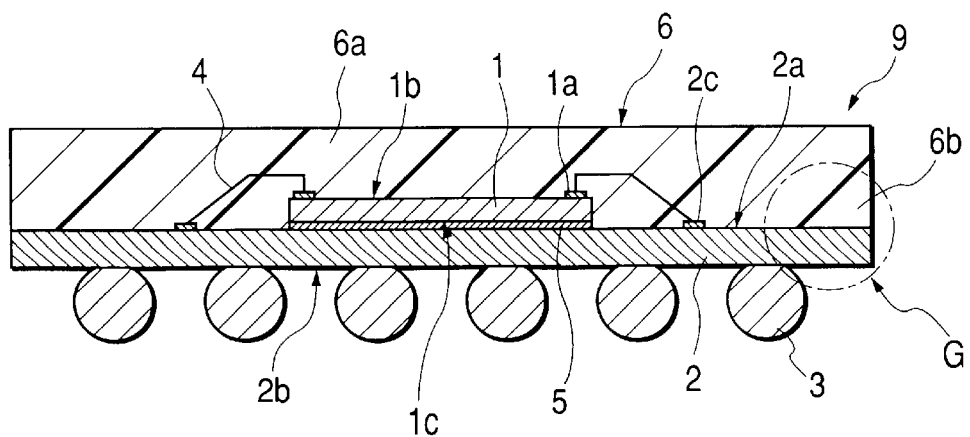
Figure 18A:
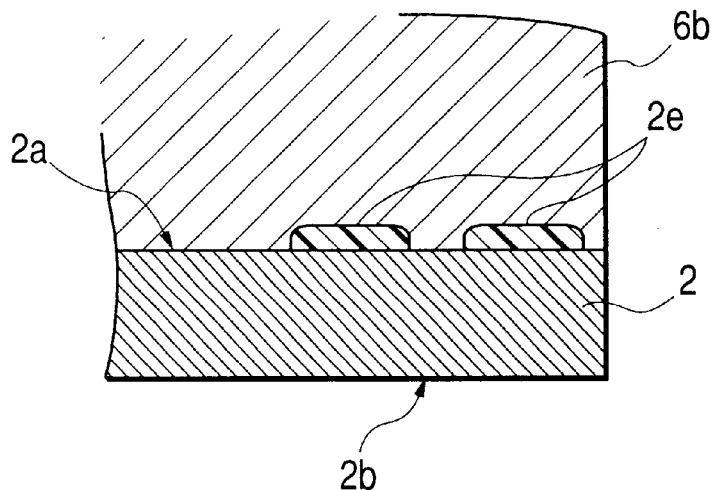

Reference is here made to a CSP 9 according to a modified example shown in FIGS. 17(a) and 17(b). As shown in FIG. 17(a), arcuate cutout portions 2d are formed in four corners of a film substrate 2 and sealing end portions 6b are bonded respectively to the cutout portions 2d. Further, as shown in FIG. 18(a), insulating convex portions 2e are formed on peripheral edge portions of a chip bearing surface of the film substrate 2, the convex portions 2e and the sealing end portions 6b being bonded together.

For example, the convex portions 2e are insulating resist films.

Figure 18B:
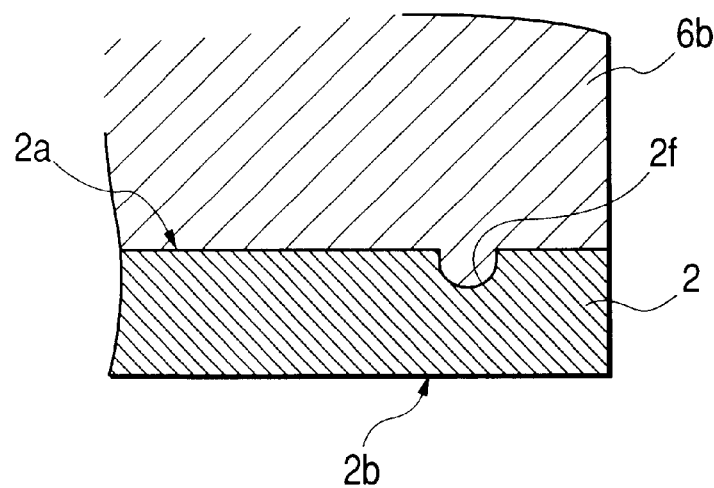

FIG. 18(b) shows a structure wherein, in the CSP 9 of the modified example shown in FIG. 17, concave portions 2f are formed in peripheral edges of the chip bearing surface 2a of the film substrate 2, and the concave portions 2f and the sealing end portions 6b are bonded together.

According to the CSP 9 of the modified example shown in FIG. 17, the cutout portions 2d are formed in the peripheral edges of the film substrate 2, the sealing end portions 6b of the sealing portion 6 are disposed in the cutout portions 2d, and at least one of the concave portions 2f and the convex portions 2e are formed in the peripheral edges of the film substrate 2 and are bonded to the sealing end portions 6b, whereby it is possible to enhance the bonding force between the sealing portion 6 including the sealing end portions 6b and the film substrate 2.

Further, since at least one of the concave portions 2*f* and the convex portions 2*e* are formed, even in the event of occurrence of substrate peeling, the stress induced can be dispersed and relaxed by the concave portions 2*f* or the convex portions 2*e*. As a result, it is possible to suppress the progress of substrate peeling.

Therefore, it is possible to prevent peeling between the molding resin and the film substrate 2 during dicing and also possible to eliminate damage to the bonded portions of the wires 4 and the connecting terminals 2*c* on the film substrate 2. As a result, it is possible to improve the quality of CSP 9.

A ball bonded state according to a modified example shown in FIGS. 19 and 20(*a*) and (*b*) represents a CSP 9 of a bump peripheral layout type in which bump lands 7*f* and bump electrodes connected thereto are arranged in a peripheral portion of a device area 7*c*. By adopting such a bump periphery layout type it is possible to facilitate the layout of wiring on the film substrate 2 and the mounting substrate (see FIG. 21).

Further, by insulating the semiconductor chip 1 and the film substrate 2 from each other with use of an insulating film such as a solder resist film 2*g* for example it is possible to prevent the back side of chip from contacting the wiring on the film substrate 2.

Figure 21:
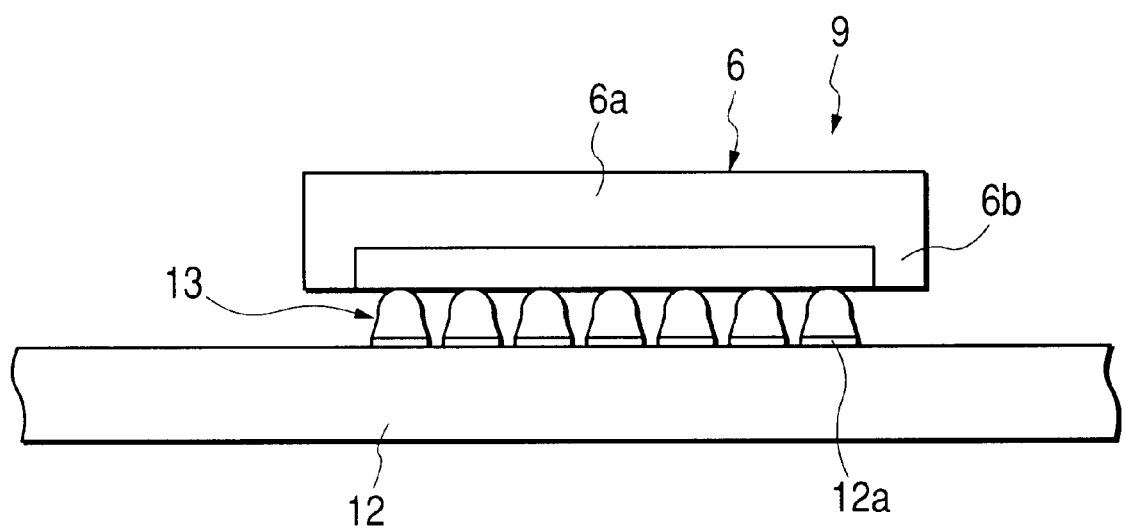
FIG. 21 is a side view of the semiconductor device (CSP) embodying the invention as mounted on a mounting substrate.

FIG. 21 shows a state in which a semiconductor device (CSP 9) embodying the present invention has been mounted on a mounting substrate. The mounting process comprises the steps of providing a mounting substrate 12 having mounting lands 12*a*, applying a solder paste onto the lands 12*a*, disposing the CSP 9 on the mounting substrate 12 so that solder balls 3 (see FIG. 1) are located on the lands 12*a* through the solder paste, and placing the CSP 9 as disposed on the mounting substrate into a reflow furnace to reflow the solder balls 3 and the solder paste, allowing the CSP 9 and the lands 12*a* on the mounting substrate 12 to be electrically connected with each other.

In the case where an insulating material having a very large thermal expansion coefficient in comparison with that of the semiconductor 1, such as a glass-incorporated epoxy resin, is used as the insulating material which constitutes the mounting substrate 12, it is desirable that a flexible material such as an epoxy resin be used as the material of the film substrate 2, whereby it is possible to relax a stress induced by a difference in thermal expansion coefficient between the semiconductor chip 1 and the mounting substrate 12 and it is possible to prevent the occurrence of defects such as breakage of solder fillets 13 caused by the aforesaid stress.

Although the invention accomplished by the present inventor has been described concretely by way of embodiments thereof, it goes without saying that the present invention is not limited to the above embodiments and that various changes may be made within the scope not departing from the gist of the invention.

For example, although in the above embodiments the plural through holes formed in the film base substrate 7*b* are circular, the shape of the through holes 7*e* is not limited to a circular shape, but may be any other polygonal shape, e.g., a square shape.

Although in the above embodiments the film base substrate 7*b* is constituted by a thin film wiring board such as a polyimide board, it may be formed using a material other than polyimide insofar as the film base substrate 7*b* is a thin film wiring board having flexibility.

Although in the above embodiments the dicing work was performed by a combination method of both the down cutting method and the up cutting method, the dicing work may be done by only the down cutting method.

Although in the above embodiments the semiconductor device is CSP 9, it may be any other semiconductor device, e.g., BGA, than CSP 9 insofar as the semiconductor device used is of the type which is obtained by dicing after a block molding using the multi device substrate 7 having plural thin film wiring boards.

The following is a brief description of effects obtained by typical inventions out of those included in the present application.

(1) Since cutout portions are formed in peripheral edge portions of a thin film wiring board in a semiconductor device and sealing end portions of a sealing portion are disposed in the cutout portions, the cutting blade mainly cuts the molding resin at the time of dicing after a block molding. Therefore, it is possible to prevent peeling between the molding resin and the thin film wiring board during dicing, whereby it is possible to improve the quality of the semiconductor device.

(2) Since cutout portions are formed in corners of a thin film wiring board and sealing end portions of a sealing portion are disposed in the cutout portions, the cutting blade cuts only the molding resin at the corners where substrate peeling is apt to occur during dicing, so that the occurrence of peeling between the molding resin and the thin film wiring board at the corners of the substrate can be prevented during dicing and hence it is possible to improve the quality of the semiconductor device.

(3) In the manufacture of a semiconductor device there is used a multi device substrate having plural thin film wiring boards capable of being deformed following shrinkage on curing of a molding resin and the multi device substrate is divided device area by device area by dicing in accordance with a down cutting method, whereby it is possible to prevent peeling between the molding resin and the thin film wiring boards during dicing and hence possible to improve the quality of the semiconductor device.

(4) Cutout portions are formed in peripheral edges of a thin film wiring board in a semiconductor device and sealing end portions of a sealing end are disposed in the cutout portions, further, at least one of concave portions and convex portions are formed in the peripheral edges of the thin film wiring board and are bonded to the sealing end portions, whereby the bonding force between the sealing end portions and the thin film wiring board can be enhanced and a stress induced upon occurrence of substrate peeling can be dispersed by the concave or convex portions. As a result, the progress of the substrate peeling can be suppressed and hence it is possible to prevent damage to the bonded portions between wires and electrodes on the thin film wiring board, thus permitting improvement in quality of the semiconductor device.

What is claimed is:

1. A method of manufacturing a semiconductor device, comprising the steps of:

providing a flexible Wiring substrate having a front surface, a back surface opposite from the front surface, a plurality of device areas of the front surface thereof and a plurality of electrodes formed on each device area;

providing semiconductor chips each having a main surface, a back surface opposed of the main surface thereof and a plurality of electrodes formed on the main surface;

mounting the semiconductor chips respectively on the device areas of the front surface of the flexible wiring substrate;

connecting electrodes of the semiconductor chips with the electrodes of the flexible wiring substrate on respective device areas of the front surface of the flexible wiring substrate by means of conductive members;

sealing the semiconductor chips and the plural device areas of the front surface of the flexible wiring substrate by a resin body formed according to a block molding method;

cutting the flexible wiring substrate and the resin body to divide them between respective device areas of the front surface of the flexible wiring substrate using a cutting blade, wherein, in the cutting step, a rotation axis of the cutting blade is positioned over the back surface of the flexible wiring substrate, and moving the cutting blade while feeding the wiring substrate and the resin body in a same direction as rotation of the cutting blade.

2. A method of manufacturing a semiconductor device according to claim 1, wherein, in the mounting step, facing the surface of the semiconductor chip to corresponding device area of the front surface of the flexible wiring substrate, and arranging the semiconductor chip as the electrodes of the flexible wiring substrate is positioned at the outside of corresponding semiconductor chips, wherein, in the connecting step, connecting the electrodes of the semiconductor chips with the electrodes of the flexible wiring substrate by wire bonding method with a plurality of wires, and wherein, in the sealing step, sealing connecting portions of the wires and the electrodes of the flexible wiring substrate by the resin body.

3. A method of manufacturing a semiconductor device according to claim 2, wherein, in the cutting step, cutting all outlines of device areas with moving the cutting blade while feeding the wiring substrate and the resin body in a same direction as rotation of the cutting blade.

4. A method of manufacturing a semiconductor device according to claim 2, wherein the flexible wiring substrate is comprised of a polyimide film.

5. A method of manufacturing a semiconductor device according to claim 3, wherein the flexible wiring substrate is comprised of a polyimide film.

* * * * *